United States Patent

Carlson

[15] 3,694,756

[45] Sept. 26, 1972

[54] MIXER CIRCUIT

[72] Inventor: David John Carlson, Indianapolis, Ind.

[73] Assignee: RCA Corporation, New York, N.Y.

[22] Filed: May 11, 1970

[21] Appl. No.: 36,015

Related U.S. Application Data

[63] Continuation-in-part of Ser. No. 729,747, May 16, 1968, abandoned.

[52] U.S. Cl.....................................325/451, 325/459

[51] Int. Cl.................................................H04b 1/06

[58] Field of Search......325/459, 444, 439, 455, 436, 325/318, 450, 441

[56] References Cited

UNITED STATES PATENTS

| | | | |
|---|---|---|---|
| 3,107,331 | 10/1963 | Barditch et al. | 325/451 |
| 3,348,154 | 10/1967 | Fish, Jr. et al. | 325/451 |
| 3,544,903 | 12/1970 | Sakamoto | 325/459 |
| 3,505,620 | 4/1970 | Miner | 325/459 |

*Primary Examiner*—Robert L. Griffin
*Assistant Examiner*—Barry L. Leibowitz
*Attorney*—Eugene M. Whitacre

[57] ABSTRACT

A transistor mixer circuit includes a first transistor interconnected in a common emitter configuration and having its collector electrode connected by circuit means to the emitter electrode of a transistor interconnected in a common base configuration. Means aRe provided for applying a locally generated signal and a radio frequency signal to the input electrode of the first transistor, and circuit means are provided for deriving intermediate frequency signals from the output electrode of the second transistor. The mixer circuit is adapted to be split into two units to permit separate and independent alignment of the radio frequency and the intermediate frequency circuitry.

A coupling arrangement is provided for split mixer stages of the type having a first and a second mixer unit. A television cabinet has a television chassis and a television tuner mounted within the cabinet. The tuner houses an RF amplifier stage, a local oscillator stage and a first mixer unit. One end of a cable is coupled to the input of the television chassis IF signal processing circuits and the other end of the cable is connected to the second mixer unit which is housed within a conductive enclosure. The enclosure is detachably connected to the tuner to provide a circuit path between the first mixer unit housed within the tuner and the second mixer unit housed within the enclosure.

25 Claims, 10 Drawing Figures

INVENTOR
DAVID JOHN CARLSON

BY David E. Pitchenik
ATTORNEY

INVENTOR
DAVID JOHN CARLSON
BY David E. Pitchenik
ATTORNEY

INVENTOR
DAVID JOHN CARLSON
BY David E. Pitchenik
ATTORNEY

MIXER CIRCUIT

This is a Continuation-In-Part of an application filed May 16, 1968, Ser. No. 729,747, now abandoned, entitled "Mixer Circuit," and assigned to RCA Corp.

This invention relates to mixer circuits and more particularly to transistor mixer circuits for heterodyne receiver systems.

In the past, because of the parasitic feedback capacity between the output electrode and the input electrode of transistor mixer circuits, it has been necessary to provide a neutralization capacitor. Typically, the neutralization capacitor is connected between an inductor in the mixer tank circuit and the transistor input electrode. This feedback neutralizes the parasitic feedback of intermediate frequency (IF) signal components from the transistor output circuit back to the transistor input circuit. Because of the expense of the neutralization capacitor and the additional factory operation of adjusting the neutralization capacitor, it is desirable that transistor mixers operate in a satisfactory manner without the necessity of neutralization.

Another major problem of tuner fabrication has been the interaction of the tuner stage of a receiver with the IF signal processing circuitry of the receiver. Because of the interaction, alignment of the receiver must be accomplished with the tuner connected. Consequently, should the tuner be removed for servicing, realignment of the receiver is required. Moreover, the interaction of the tuner and the IF signal processing circuitry prevents a modular approach to receiver fabrication. That is, an approach wherein modules, such as a tuner, are separately fabricated and suitable for use with any other modular component.

A mixer circuit embodying the present invention is adapted to be utilized in a heterodyne receiver system wherein radio frequency (RF) signals are converted to IF signals by mixing the RF signals and a locally generated signal. Means are provided for applying RF signals to the input electrode of a first transistor which is interconnected in a common emitter configuration. Means are also provided for applying a locally generated signal to the input electrode of the first transistor. Circuit means interconnect the output electrode of the first transistor and the input electrode of a second transistor which is interconnected in a common base configuration. IF signals are derived from the output electrode of the second transistor. The interconnecting circuit means, in accordance with a feature of the invention, may be of the type which permits two transistors to be detachably connected, as for example, by connectors. Here, the mixer is divided into two stages or units, a first unit including the first transistor and the second unit including the second transistor.

Where the mixer is divided into two stages with the common base stage mounted on the television chassis near the IF signal processing circuits, oscillation at the IF frequency may occur. This is due to the increased IF signal gain and various regenerative feedback signal current paths. Specifically, the common base stage not only mixes RF and local oscillator signals applied to its input electrode but also amplifies IF signals from the common emitter stage. Although redesign of the television chassis IF circuits to accommodate the additional IF signal gain is well within the state of the art, it may be undesirable because of the cost and time involved.

Moreover, where the television chassis IF signal processing circuits are redesigned, it commits the chassis to utilization of television tuners of the particular configuration described.

In accordance with another feature of the invention, a coupling arrangement is provided for split mixer stages of the type having a first and a second mixer unit. A television cabinet includes a television chassis and a television tuner mounted within the cabinet. The tuner houses an RF amplifier stage, a local oscillator stage and a first mixer unit. One end of a cable is coupled to the input of the television chassis IF signal processing circuits and the other end of the cable is connected to the second mixer unit which is housed within a conductive enclosure. The enclosure may be detachably connected to the tuner to provide a circuit path between the first mixer unit housed within the tuner and the second mixer unit housed within the enclosure.

The second mixer unit housed within the conductive enclosure may derive DC operating potential from the television chassis through the coupling cable. To avoid accidental shorting and shock hazard, a capacitor may be connected in series between the second mixer unit and the detachable connector to prevent a DC potential from being applied to the connector.

The novel features of the invention are set forth with particularity in the appended claims.

The invention, both as to its organization and manner of operation, may best be understood by reference to the following description, when taken in conjunction with the accompanying drawings, in which.

Figure 1:
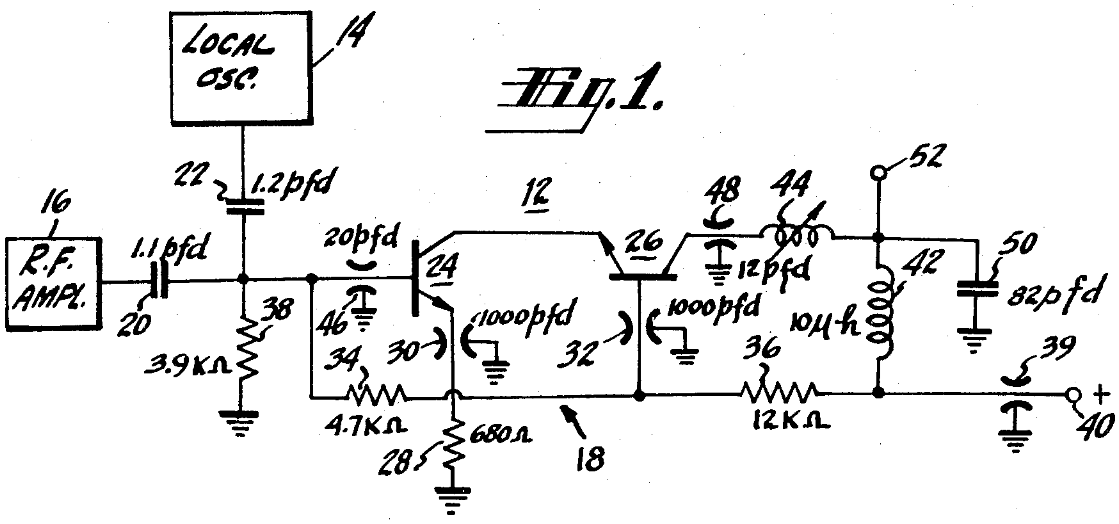
FIG. 1 is a schematic circuit diagram of a transistor mixer circuit embodying the invention.

Referring now to the drawings, wherein like reference numerals designate similar elements in the various figures, and more particularly to FIG. 1, a radio receiver tuner 12 includes a local oscillator stage 14, an RF amplifier stage 16 and a mixer stage 18. RF signals are coupled from the amplifier stage 16 via a capacitor 20 to the mixer stage 18, and locally generated signals from the oscillator stage 14 are coupled to the mixer stage 18 via a capacitor 22. The RF signal and the oscillator signal are heterodyned in the mixer stage 18 to produce an IF signal which may be processed by if signal processing circuits of a radio receiver, not shown.

The mixer stage 18 includes two transistors 24 and 26. The transistor 24 is interconnected by circuit components in a common emitter configuration, and the transistor 26 is interconnected by the circuit components in the common base configuration. Specifically, the emitter electrode of the transistor 24 is connected to ground by a resistor 28 and a feedthrough capacitor 30, the feedthrough capacitor providing signal frequency ground for the emitter electrode. The base of the transistor 26 is connected to ground for signal frequencies by the feedthrough capacitor 32. The base electrode of the transistor 26 is also connected to the junction of the bias resistors 34 and 36 which are serially connected with a resistor 38 between a source of operating potential applied at terminal 40 and the ground. A feedthrough capacitor 39 prevents any RF OR IF signal from affecting the source of operating potential. The serially connected resistors provide the necessary bias potential for the transistors, and thus, the base electrode of the transistor 24 is connected to the junction of the resistors 34 and 38. To complete the bias for the mixer stage 18, a choke 42 and a serially connected variable inductor 44 interconnect the source of operating potential at the terminal 40 and the collector electrode of the transistor 26.

Input signals to the mixer 18, the RF signal and the local oscillator signal, are applied at the junction of the base electrode of the transistor 24 and the impedance matching feedthrough capacitor 46 where they are heterodyned in the transistor to produce an IF signal. The IF signal appears at the collector electrode of the transistor 24 which is directly connected to the emitter electrode of the transistor 26, a low impedance point. This insures that there will be a minimum of feedback capacity between the collector electrode of the transistor 24 and its input circuit.

As capacitance is the change in voltage between two points with respect to time, that is, *de/dt*, and moreover, since the collector electrode of the transistor 24 is connected to a low impedance point where only a small voltage can be developed, the time variation of the voltage at the collector electrode with respect to the base electrode is small, hence, only a small parasitic feedback voltage exists between the collector and base electrodes of the transistor 24. Consequently, no neutralization capacitor is needed to counter the effects of the parasitic feedback capacitance. Should it be desired, the connection between the collector electrode of the transistor 24 and the emitter electrode of the transistor 26 can be supported by a standoff terminal, not shown. This terminal provides structural support with a very small capacitance and can be used as an alignment point for a radio receiver.

The IF signals appearing at the collector electrode of the transistor 24 are amplified by the transistor 26 to provide an IF signal across a resonant circuit connected to its collector electrode. The resonant circuit includes the variable inductor 44 and capacitors 48 and 50, the components being proportioned for resonance at the frequency of the IF signal. IF signals are available at a terminal 52 for further processing by the radio receiver.

With the current Federal Communication Commission's assignment of television frequencies for the various channels, it has been noted that distortion of the reproduced video and sound signal often occurs when the receiver is tuned to channel 6. The Federal Communication Commission's standards are republished in *Television Engineering*, by Donald G. Fink, McGraw-Hill Book Co., Inc., 1952, in the appendix on page 691. The distortion can be traced to undesired signals resulting from harmonics and the various combinations of the sound and picture carriers of the channel 6 signal heterodyning with the locally generated signal. Two particularly difficult spurious responses at channel 6 are formed as follows: (1) picture carrier for channel 6 (83.25 MHz) + sound carrier for channel 6 (87.75 MHz) − local oscillator for channel 6 (129 MHz) = 42 MHz; (2) 2 × sound carrier for channel 6 (87.75 MHz) − local oscillator for channel 6 (129 MHz) = 46.5 MHz. As the IF bandpass for television receivers ranges from 41 to 47 MHz, the channel 6 spurious responses of 42 MHz, which is within 170 KHz of the color subcarrier, and 46.5 MHz are particularly troublesome.

Figures 2, 3:
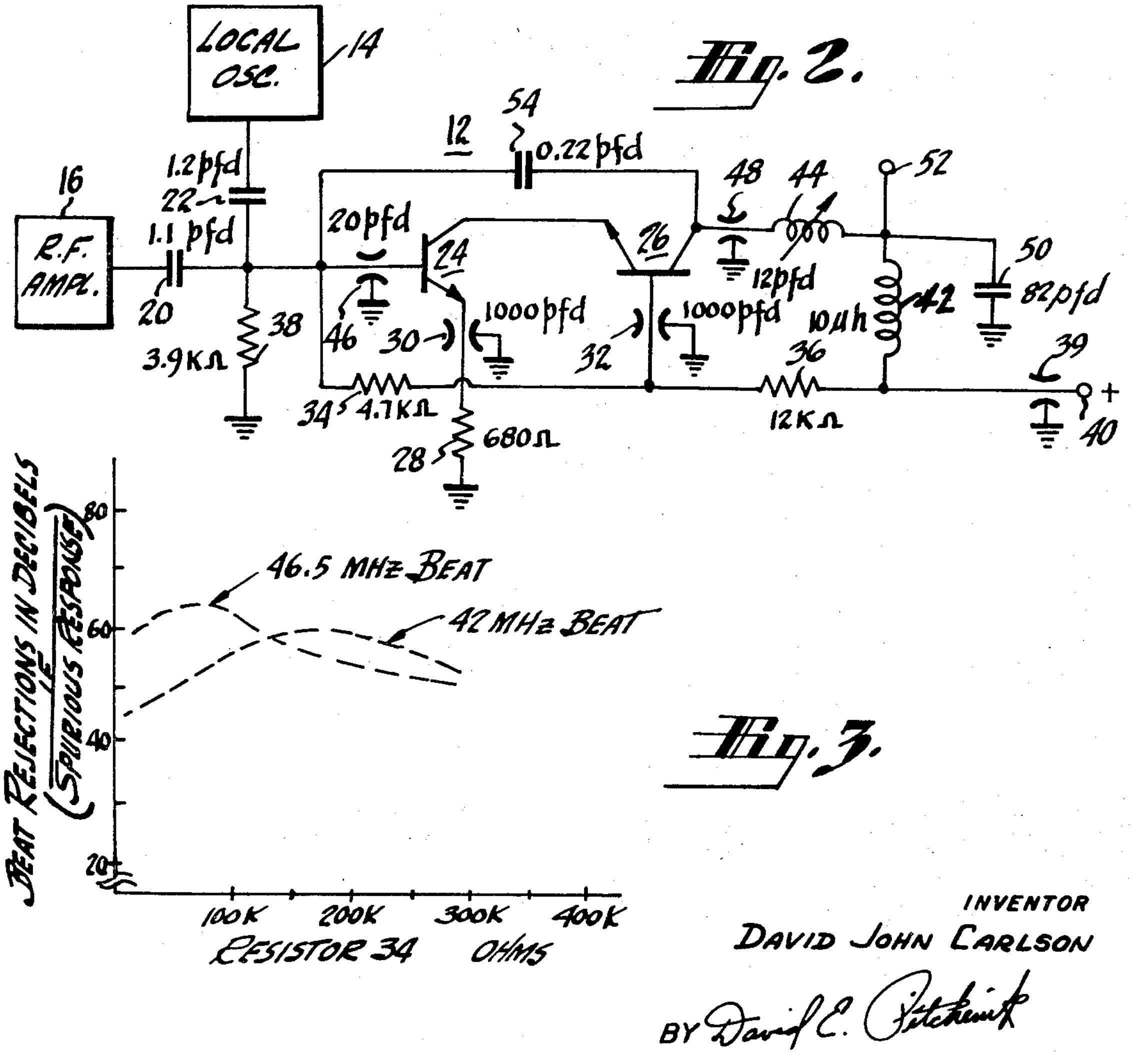
FIG. 2 is a schematic circuit diagram of the transistor mixer shown in FIG. 1 with a feedback capacitor utilized to minimize spurious responses.
FIG. 3 is a graph illustrating certain features of the spurious response attenuation characteristics of the transistor mixer circuit of FIG. 1.

An improvement in the beat rejection of the mixer circuit can be achieved by the employment of a small feedback capacitor. This may be particularly desirable for improved beat rejection of the spurious responses at channel 6. Consequently, as is shown in FIG. 2, a small fixed value feedback capacitor 54 is coupled between the collector electrode of the transistor 26 and the base electrode of the transistor 24. The capacitor 54 may improve the beat rejection because of secondary mixing occurring in the transistor 26 as the result of the basic carrier and oscillator signals which are amplified in the transistor 24, or may aid in the cancellation or reduction of higher order nonlinearities in thy mixer circuit.

It has been found that the spurious response rejection capability of the mixer circuit can be optimized by careful selection of the bias resistors. FIG. 3 illustrates the attenuation of the 42 and 46.5 MHz beats as a function of the resistance of bias resistor 34 for the component values shown in the various figures. The particular value of resistance for optimum performance depends, in part, upon the mixer circuit transistor parameters.

Figures 4, 5, 6:
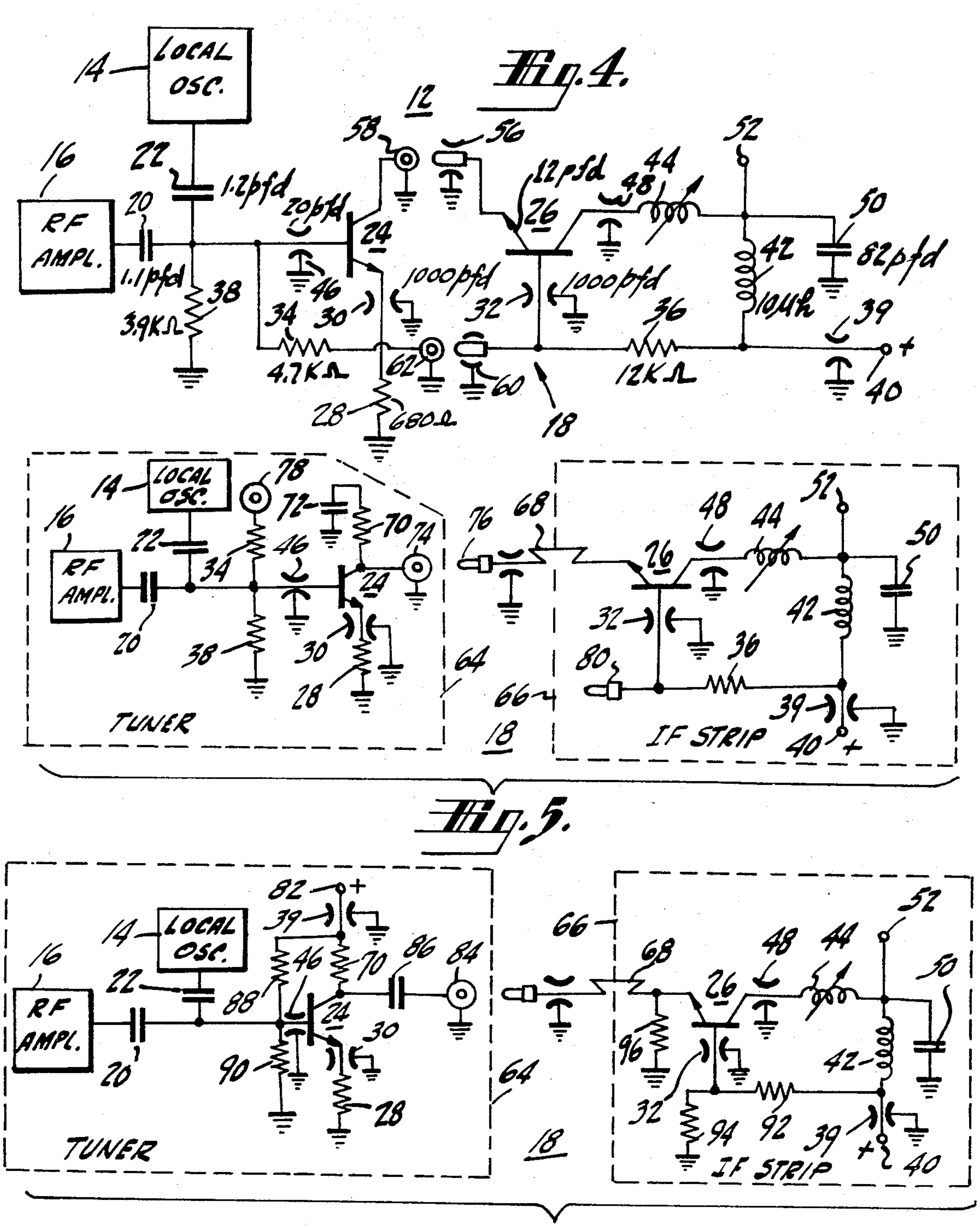
FIG. 4 is a schematic circuit diagram of a transistor mixer which permits separate alignment of a radio receiver tuner and the succeeding IF signal processing circuitry in accordance with the invention.
FIGS. 5 and 6 are schematic circuit diagrams illustrating modifications of the transistor mixer circuit shown in FIG. 4 to permit coupling between the transistors of the mixer with an arbitrary length of cable.

Reference is now made to FIG. 4 which is a schematic circuit diagram of a transistor mixer permitting separate alignment of a radio receiver tuner and the succeeding IF signal processing circuitry. Because the emitter electrode of the transistor 26 is a low impedance point, there is little interaction between the local oscillator stage 14 and the RF amplifier stage 16, and the transistor 24 with its associated circuitry as one unit and the transistor 29 with its associated circuitry and the succeeding IF signal processing circuitry, not shown, as the second unit. Consequently, it may be desirable to break the direct connection, shown in FIG.

1, between the collector electrode of the transistor 24 and the emitter electrode of the transistor 26.

The mixer circuit may therefore be divided into two parts; the common emitter section remaining on the tuner chassis and the common base section being put with the IF signal processing circuitry. The interconnection between these two halves may be facilitated by means of an appropriate connector such as a plug 56 and jack 58. In a like manner, the break in the mixer bias circuitry which is required may be facilitated by means of another plug 60 and jack 62.

The breaking of the mixer circuit 18 into two parts allows a separate and independent alignment of the tuner at RF frequencies and the succeeding IF signal processing circuitry at IF frequencies. Because there is a minimal interaction between the two parts, servicing and factory replacement is facilitated due to the interchangeability of parts without realignment of the entire receiver.

To further implement the modular approach to television receiver fabrication, the split mixer stage 18 can be modified to permit coupling between the two units by means of an arbitrary length of coaxial cable. Referring now to FIG. 5, the mixer circuit 18 is broken into two units 64 and 66. The units are interconnected by a coaxial cable 68.

To provide proper impedance matching between the collector electrode of the transistor 24 and the coaxial cable 68, a load resistor 70, which approximates the characteristic impedance of the cable, is connected in series with a DC blocking capacitor 72 between the collector electrode of the transistor 24 and the ground. The collector electrode of the transistor 24 may be coupled to the coaxial cable 68 by a jack 74 and a plug 76. In a like manner, to complete the mixer bias circuitry, the resistor 34 may be coupled to the base electrode of the transistor 26 by a jack 78 and plug 80. It should be noted that the coaxial cable 68 is not terminated with its characteristic impedance at the emitter electrode of the transistor 26. This is because the emitter electrode of the transistor 26 is a low impedance point and the mismatch is needed, for reasons previously described, to insure that the parasitic feedback capacitance is small.

The split mixer circuit can also be arranged for a parallel bias of the two units 64 and 66 as shown in FIG. 6. Again, to provide proper impedance matching between the collector electrode of the transistor 24 and the coaxial cable 68, a load resistor 70, which approximates the characteristic impedance of the cable, is connected between the collector electrode of the transistor 24 and a source of operating potential applied at the terminal 82. The collector electrode of the transistor 24 is coupled to a jack 84 by a DC blocking capacitor 86. The capacitor 86 prevents DC interaction between the units 64 and 66.

The DC bias for the mixer circuit is a parallel connection. That is, the transistor 24 is biased from a source of operating potential applied to the terminal 82 and coupled to the collector electrode by the resistor 70 and to the base electrode by the serially connected resistors 88 and 90. The DC bias for the transistor 26 is obtained from the source of operating potential applied to the terminal 40. This potential is applied to the collector electrode of the transistor by the serially connected choke 42 and variable inductor 44 and to the base electrode of the transistor by the serially connected resistors 92 and 94. The resistor 96 coupled between the emitter electrode of the transistor 26 and the ground provides the necessary DC emitter return for the grounded base portion and can also be used for loading, if desired.

Referring now to FIGS. 7-10, a television picture tube 114 is mounted within a television cabinet 112. The tube is positioned within the cabinet so that the face 116 of the picture tube is viewable through an opening in the cabinet front wall 118. Mounted to the cabinet front wall are a UHF television tuner 120 and a VHF television tuner 122. The television receiver chassis 124 is mounted on the bottom portion of the television cabinet 112. The chassis includes the IF signal processing circuits and other circuitry commonly associated with television chassis to process intermediate frequency signals to obtain video and deflection signals to be applied to the television picture tube 114 and its associated deflection and convergence windings.

While a television tuner is generally considered to include an RF amplifying or preselector stage, a local oscillator stage, and a mixer stage, for the purpose of the discussion relating to FIGS. 7-10, the term tuner is used to indicate the presence of tunable resonant circuits utilized to select a given band of frequencies (television channel) within a larger band of frequencies (54 – 216 MHz for VHF television signals and 470 – 890 MHz for UHF television signals). The tuner may or may not contain the entire mixer stage.

Figures 8, 9:
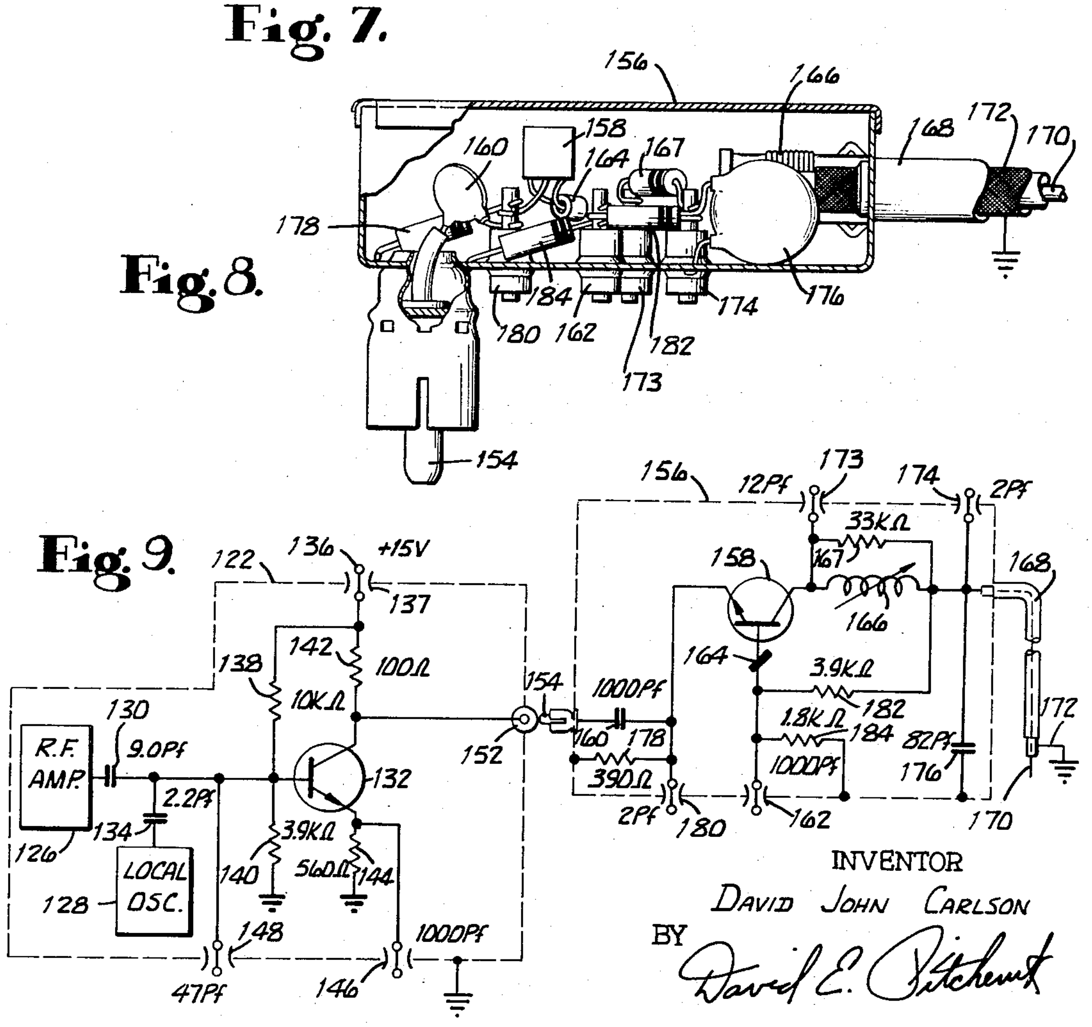
FIG. 8 is an enlarged side view of the conductive enclosure shown in FIG. 7 partially broken away to show the circuit components mounted within the enclosure.
FIG. 9 is a schematic circuit diagram of the television tuner and chassis coupling arrangement shown in FIG. 7.

The VHF television tuner 122 includes an RF amplifier stage 126 and a local oscillator stage 128 shown in block form in FIG. 9. Signals from the RF amplifier stage 126 are applied via a coupling capacitor 130 to the base electrode of a first mixer transistor 132. In a like manner, the local oscillator signal is coupled via a coupling capacitor 134 to the base electrode of the transistor 132. The transistor 132 forms a portion of the television mixer stage and is connected in a common emitter configuration. Operating potential for the transistor is derived from a terminal 136 which is bypassed for signal frequencies by a feedthrough capacitor 137. The potential at the terminal 136 is applied via the voltage divider resistors 138 and 140 to the base electrode of the transistor 132. The potential at the terminal 136 is also applied to the collector electrode of the transistor 132 via a resistor 142. A resistor 144 which is bypassed for signal frequencies by a feedthrough capacitor 146 connects the emitter electrode of the transistor 132 to a fixed reference potential, shown as ground. A feedthrough capacitor 148 is connected to the base electrode of the transistor 132 and, in association with other components, not shown, serves as a peaking network for the signals appearing at the base electrode of the transistor 132.

Output signals from the VHF tuner 122 are derived from the collector electrode of the transistor 132 and coupled via a jack 152 and a plug 154 to signal processing circuits mounted within a conductive enclosure 156. The specific signal processing circuits within the conductive enclosure 156 form the remaining portion of the mixer stage and includes a second mixer transistor 158 and its associated circuitry. As is most clearly shown in FIG. 7, the conductive enclosure 156 is mounted within the television cabinet 112 in close proximity to the VHF television tuner and at a distance from the television chassis 124.

Signals applied to the plug 154 are coupled via capacitor 160 to the emitter electrode of the second mixer transistor 158. The capacitor lead coupled to the plug 154 is insulated to prevent accidental shorting (FIG. 8). The base electrode of the transistor 158 is connected to ground for signal frequencies by a feedthrough capacitor 162. A ferrite bead 164 is applied to the base electrode lead to suppress high frequency oscillation.

The collector electrode of the transistor 158 is connected to a coaxial cable 168 by the parallel combination of an adjustable inductor 166 and a resistor 167. The coaxial cable includes an inner conductor 170 and an outer conductor 172. The adjustable inductor 166 in association with the feedthrough capacitors 173-174 and capacitor 176 form an IF tuned circuit coupled between the collector electrode of the transistor 158 and the coaxial cable 168. Resistor 167 modifies the figure of merit or Q of the tuned circuit to provide the desired frequency bandwidth.

Figures 7, 10:
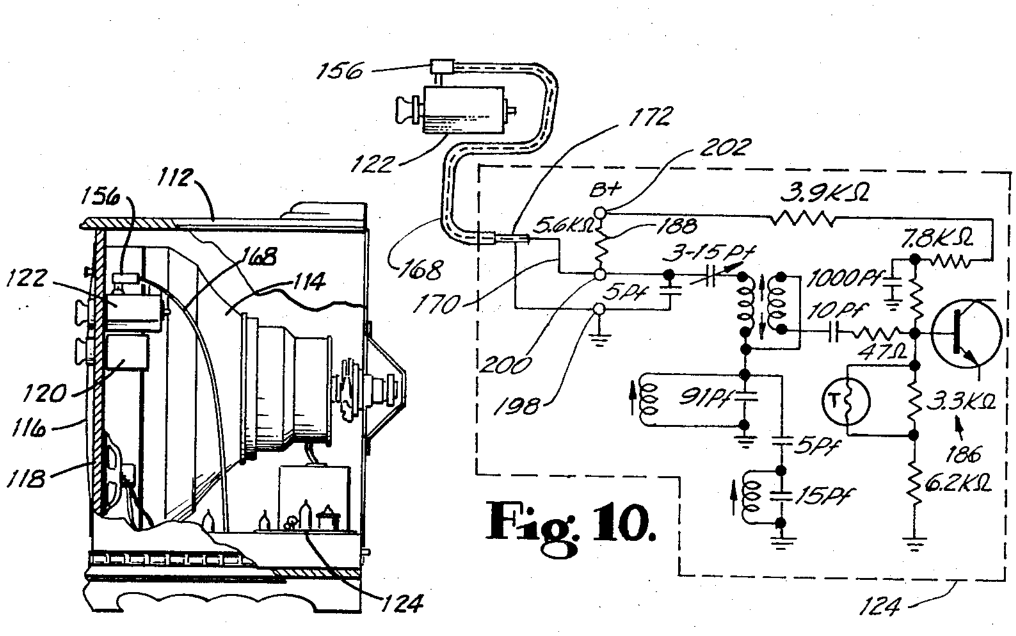
FIG. 7 is a side view of a television receiver partially broken away to show a television tuner and chassis coupling arrangement suitable for television tuner mixer circuits of the type that permit separate alignment of the tuner and the chassis.
FIG. 10 is a schematic circuit diagram of the interconnection between the television chassis IF circuits and the cable coupled to the components within the conductive enclosure.

One end of the coaxial cable 168 is connected to the television chassis 124. The inner conductor 170 is connected to the input terminal 200 of the television chassis IF signal processing circuits 186, only the first stage of which is shown (FIG. 10). The IF signal processing circuits may be similar to those shown in Television Service Data, File 1969 No. T8. Copies of the Service Data may be obtained from RCA Corp., 600 North Sherman Drive, Indianapolis, Ind. The outer conductor 172 is connected to the chassis terminal 198 which is maintained at the chassis fixed reference potential, ground potential. The opposite end of the coaxial cable 168 is connected to the conductive enclosure 156 and signal processing circuits. At this end, the inner conductor 170 is coupled to the signal processing circuits and the outer conductor 172 is connected to the conductive enclosure 156. As a result, the conductive enclosure is connected to the chassis fixed reference potential by the outer conductor 172. The cable is connected to the chassis 124 IF signal processing circuits in a manner such that a DC potential is applied to the cable inner conductor 170. A source of DC potential for the IF signal processing circuits is applied to the chassis terminal 202. The terminal 202 is coupled by a resistor 188 to the terminal 200 to apply the potential to the cable inner conductor. The resistor 188 cooperates with filtering capacitors, not shown, to prevent the IF signal applied to the terminal 200 from affecting the B+ supply.

Operating potential for the second mixer transistor 158 is obtained from the coaxial cable inner conductor 170 and is applied to the collector electrode of the second mixer transistor 158 via the adjustable inductor 166. The emitter electrode of the transistor 158 is returned to the chassis fixed reference potential by resistor 178 which is bypassed by a feedthrough capacitor 180. The resistor 178-capacitor 180 combination functions to roll off the transistor's high frequency gain to help prevent spurious oscillations. The operating potential obtained through the coaxial cable inner conductor 170 is also applied to the base electrode of the transistor 158 by the voltage divider resistors 182 and 184.

Although the second mixer transistor 158 heterodynes RF and local oscillator signals applied to plug 154, it also provides amplification of IF signals at the plug. These IF signals result from the heterodyning of RF and local oscillator signals in the first mixer transistor 132. Because the conductor enclosure 156 is mounted at a distance from the television chassis circuits, undesired interaction between the second mixer transistor and its associated circuitry with the television chassis 124 IF circuits is significantly minimized. During manufacture, the cable 168 and conductive enclosure 156 with its circuitry are assembled with the television chassis 124. When the television chassis is aligned, the plug 154 is connected to a suitable source of signals and the various tuned circuits are adjusted. The capacitor 160, connected between the plug 154 and the emitter electrode of the second mixer transistor 158, prevents the DC potential at the emitter electrode of the second mixer transistor 158 from being applied to the plug 154. This reduces the possibility of accidental shorting and shock hazard. The VHF television tuner 122 may be separately manufactured and independently aligned.

What is claimed is:

1. In a television receiver tuner system for converting received radio frequency television signals to intermediate frequency signals by mixing the radio frequency television signals and a locally generated signal, a mixer stage comprising:

a first transistor having an input electrode and an output electrode and interconnected in a common emitter configuration;

a second transistor having an input electrode and an output electrode and interconnected in a common base configuration, the input electrode of said second transistor exhibiting a low input impedance;

means for applying said radio frequency television signals to the input electrode of said first transistor;

means for applying said locally generated signals to the input electrode of said first transistor;

circuit means having a low impedance to radio frequency signals interconnecting the output electrode of said first transistor and the input electrode of said second transistor such that the output electrode of said first transistor is maintained at a low impedance and the voltage which develops at the output electrode of said first transistor and is coupled to the input electrode of said first transistor via the inter-electrode capacity is sufficiently small that satisfactory operation obtains without applying a neutralization voltage to the input electrode of said first transistor to cancel the effects of the output-input electrode feedback; and means for deriving intermediate frequency output signals from the output electrode of said second transistor.

2. In a heterodyne receiver system for converting radio frequency signals to intermediate frequency signals of the type including a local oscillator stage, a mixer stage comprising:

a first transistor and a second transistor each having a base electrode, an emitter electrode and a collector electrode;

means for coupling said radio frequency signals to the base electrode of said first transistor;

means for coupling output signals developed by said local oscillator stage to the base electrode of said first transistor;

means for coupling the emitter electrode of said first transistor to a point of reference potential;

means for coupling the base electrode of said second transistor to a point of reference potential such that the emitter electrode of said second transistor exhibits a low input impedance;

circuit means having a low impedance to radio frequency signals interconnecting the collector electrode of said first transistor and the emitter electrode of said second transistor such that the collector electrode of said first transistor is maintained at a low impedance and the feedback voltage which develops at the collector electrode of said first transistor and is coupled to the base electrode of said first transistor via the inter-electrode capacity is sufficiently small for satisfactory operation without applying a voltage to the base electrode of said first transistor which is out of phase with said feedback voltage; and means for deriving intermediate frequency output signals from the collector electrode of said second transistor.

3. A mixer stage as defined in claim 2 including a capacitor coupled between the base electrode of said first transistor and the collector electrode of said second transistor.

4. In a heterodyne receiver system for converting radio frequency signals to intermediate frequency signals by mixing the radio frequency signals and a locally generated signal, a split mixer stage comprising:

a first unit including a first transistor having an input electrode and an output electrode and interconnected in a common emitter configuration, means for applying radio frequency signals to the input electrode of said first transistor and means for applying locally generated signals to the input electrode of said first transistor;

a second unit including a second transistor having an input electrode and an output electrode and interconnected in a common base configuration, the input electrode of said second transistor exhibiting a low input impedance, the output electrode of said second transistor coupled to intermediate frequency signal processing circuits;

circuit means having a low impedance to radio frequency signals including a connector coupling the output electrode of said first transistor and the input electrode of said second transistor such that the output electrode of said first transistor is maintained at a low impedance; and the voltage which develops at the output electrode of said first transistor and is coupled to the input electrode of said first transistor via the inter-electrode capacity is sufficiently small that satisfactory operation obtains without applying a neutralization voltage to the input electrode of said first transistor to cancel the effects of the output-input electrode feedback.

5. A split mixer stage as defined in claim 4 wherein said circuit means further includes a coaxial cable.

6. A split mixer stage as defined in claim 4 including a first conductive housing enclosing said first unit and RF signal selection circuits, and a second conductive housing enclosing said second unit.

7. A split mixer stage as defined in claim 6 wherein said second conductive housing is connected to a radio receiver chassis including said intermediate signal processing circuits by a two wire cable.

8. In a heterodyne receiver system for converting radio frequency signals to intermediate frequency signals by mixing the radio frequency signals and a locally generated signal, a split mixer comprising:

a first unit including a first transistor having an input electrode and an output electrode and interconnected in a common emitter configuration, means for applying radio frequency signals to the input electrode of said first transistor and means for applying locally generated signals to the input electrode of said first transistor;

a first conductive housing enclosing said first unit and RF signal selection circuits;

a second unit including a second transistor having an input electrode and an output electrode and interconnected in a common base configuration;

a second conductive housing enclosing said second unit;

circuit means including a connector coupling the output electrode of said first transistor and the input electrode of said second transistor; and said second conductive housing connected to a radio receiver chassis including intermediate signal processing circuits by a two wire cable, a first wire of said two wire cable coupled between said output electrode of said second transistor and the input to said chassis intermediate frequency signal processing circuits and a second wire of said two wire cable coupled between said second conductive housing and a point of fixed reference potential on said chassis.

9. A split mixer stage as defined in claim 8 wherein a DC potential derived from said chassis is applied to said first wire of said two wire cable and coupled through said first wire to provide operating potential for said second transistor.

10. A split mixer stage as defined in claim 9 including a capacitor connected in series between said second transistor input electrode and said connector to prevent a DC potential from being applied to said connector.

11. A split mixer stage as defined in claim 10 wherein said first conductive housing and said second conductive housing are mounted in close proximity to each other and remote from said radio receiver chassis.

12. A split mixer stage as defined in claim 11 wherein said first and said second conductive housing and said radio receiver chassis are mounted within a cabinet which also houses a television picture tube.

13. A split mixer stage as defined in claim 12 wherein said two wire cable is a coaxial cable whose inner conductor corresponds to said first wire and whose outer conductor corresponds to said second wire.

14. In a heterodyne receiver system for converting radio frequency signals to intermediate frequency signals by mixing the radio frequency signals and a locally generated signal, a mixer stage comprising:

a first transistor having an input electrode and an output electrode and interconnected in a common emitter configuration;

a resistor and a capacitor serially connected between the output electrode of said first transistor and a point of reference potential;

means for applying radio frequency signals to the input electrode of said first transistor;

means for applying locally generated signals to the input electrode of said first transistor;

a second transistor having an input electrode and an output electrode and interconnected in a common base configuration;

circuit means including a coaxial cable interconnecting the output electrode of said first transistor and the input electrode of said second transistor; and means for deriving intermediate frequency output signals from the output electrode of said second transistor.

15. In a heterodyne receiver system for converting radio frequency signals to intermediate frequency signals by mixing the radio frequency signals and a locally generated signal, a mixer stage comprising:

a first transistor having an input electrode and an output electrode, interconnected in a common emitter configuration and operated from a source of potential;

a resistor coupled between the output electrode of said first transistor and said source of operating potential;

means for applying radio frequency signals to the input electrode of said first transistor;

means for applying locally generated signals to the input electrode of said first transistor;

a second transistor having an input electrode and an output electrode and interconnected in a common base configuration;

circuit means including a capacitor and a coaxial cable interconnecting the output electrode of said first transistor and the input electrode of said second transistor;

means for deriving intermediate frequency output signals from the output electrode of said second transistor.

16. In a split mixer stage having a first and a second mixer unit, a coupling arrangement comprising: a cabinet structure; a television tuner having alignable resonant circuits and mounted within said cabinet structure, said tuner housing an RF amplifier stage, a local oscillator stage and said first mixer unit; a television chassis having alignable resonant circuits and mounted within said cabinet structure, said chassis including IF signal processing circuits; a conductive enclosure housing said second mixer unit, said second mixer unit having a low input impedance; a cable attached at one end to the input to IF signal processing circuits, and at the other end to said second mixer unit; and means for detachably connecting said tuner and said enclosure to provide a circuit path between said first mixer unit housed within said tuner and said second mixer unit housed within said enclosure, the low input impedance of said second mixer unit isolating the alignable resonant circuits of said tuner from the alignable resonant circuits of said television chassis to permit independent alignment adjustment of either said tuner or said television chassis without the need to align the other.

17. In a split mixer stage having a first and a second mixer unit, a coupling arrangement comprising: a cabinet structure; a television tuner mounted within said cabinet structure, said tuner housing an RF amplifier stage, a local oscillator stage and said first mixer unit; a television chassis mounted within said cabinet structure; said chassis including IF signal processing circuits; a conductive enclosure housing said second mixer unit; a cable attached at one end to the input to the IF signal processing circuits, and at the other end to said second mixer unit, said cable connected in a manner such that a DC operating potential for said second mixer unit is obtained from said television chassis through said cable; and means for detachably connecting said tuner and said enclosure to provide a circuit path between said first mixer unit housed within said tuner and second said mixer unit housed within said enclosure.

18. A coupling arrangement as defined in claim 17 wherein said cable is connected in a manner such that a DC current path is provided between said conductive enclosure and said television chassis to maintain said conductive enclosure at the chassis fixed reference potential.

19. A television tuner and chassis coupling arrangement as defined in claim 18 wherein capacitor means are connected in series between said means for detachably connecting and said second mixer unit to prevent a DC potential from being applied to said means for detachably connecting.

20. A coupling arrangement as defined in claim 19 wherein said cabinet structure includes a front wall and a bottom portion, said television tuner mounted to said cabinet front wall and said television chassis mounted to said cabinet bottom portion.

21. A coupling arrangement as defined in claim 20 wherein said means for detachably connecting includes a jack and a plug.

22. A mixer stage as defined in claim 1 including a capacitor coupled between the input electrode of said first transistor and the output electrode of said second transistor.

23. A mixer stage as defined in claim 22 including a source of operating potential for said first and said second transistors, said source of operating potential coupled to the output electrode of said first transistor.

24. A mixer stage as defined in claim 3 including a source of operating potential for the collector-emitter electrode current path of said first and said second transistor, said source of operating potential coupled to the collector electrode of said second transistor.

25. A mixer stage as defined in claim 24 including a voltage divider circuit coupled between said sources of operating potential and said point of reference potential, and means connecting the base electrodes of said first and said second transistor to said voltage divider circuit.

* * * * *

UNITED STATES PATENT OFFICE
CERTIFICATE OF CORRECTION

Patent No. 3,694,756 Dated Sept. 26, 1972

Inventor(s) David John Carlson

It is certified that error appears in the above-identified patent and that said Letters Patent are hereby corrected as shown below:

In the Abstract, line 6, that portion reading "aRe" should read -- are --. Column 3, line 11, that portion reading "if" should read -- IF --. Column 4, line 45, that portion reading "thy" should read -- the --; line 64, that portion reading "29" should read -- 26 --. Column 12, line 19, that portion reading "second said" should read -- said second --.

Signed and sealed this 1st day of May 1973.

(SEAL)
Attest:

EDWARD M. FLETCHER, JR.
Attesting Officer

ROBERT GOTTSCHALK
Commissioner of Patents

FORM PO-1050 (10-69)
3530 6|72

USCOMM-DC 60376-P69
☆ U.S. GOVERNMENT PRINTING OFFICE : 1969 O—366-334